United States Patent [19]
Hernandez

[11] Patent Number: 6,097,269
[45] Date of Patent: Aug. 1, 2000

[54] ELECTRICALLY TUNABLE BAND PASS FILTER WITH SYMMETRICAL LOW-SIDE AND HIGH-SIDE PROTECTION

[75] Inventor: Gilberto J. Hernandez, Miami, Fla.

[73] Assignee: Motorola, Inc., Schaumburg, Ill.

[21] Appl. No.: 09/241,667

[22] Filed: Feb. 1, 1999

[51] Int. Cl.[7] ..................................................... H03H 7/01
[52] U.S. Cl. ............................ 333/174; 333/175; 455/340
[58] Field of Search ..................................... 333/167, 174, 333/175; 455/339, 340

[56] References Cited

U.S. PATENT DOCUMENTS

| | | | |
|---|---|---|---|
| 3,042,885 | 7/1962 | Myers | 333/175 |
| 4,956,710 | 9/1990 | Pugel | 333/175 X |
| 5,392,011 | 2/1995 | Li | 333/174 |

*Primary Examiner*—Justin P. Bettendorf
*Attorney, Agent, or Firm*—Barbara R. Doutre

[57] ABSTRACT

A tunable filter (400) provides dual injection mode operation over a continuously tunable frequency range (500). A combination of mirrored series resonant circuits (432, 446) tuned through varactors (434, 448) allows the frequency response to shift. The use of a series capacitor and shunted inductor (430, 428), (444, 442) mirrored onto each series resonator (432, 446) provides both high-side and low-side injection protection.

16 Claims, 5 Drawing Sheets

ELECTRICALLY TUNABLE BAND PASS FILTER WITH SYMMETRICAL LOW-SIDE AND HIGH-SIDE PROTECTION

TECHNICAL FIELD

This invention relates to filters and more specifically to tunable filters for communication products.

BACKGROUND

Radio receiver performance is highly dependent on the selectivity of the receiver front end. Front-end selectivity is generally provided by a bandpass filter. Bandpass filters come in a variety of structural and topological arrangements. Most bandpass filters include a plurality of reactively coupled resonators which are coupled at a center frequency. Generally, the resonators are coupled to each other by reactive components, such as capacitors, inductors, or a combination thereof.

Front-end filters may have fixed bandwidths or they may have tunable bandwidths. Filters having fixed bandwidths are typically used in narrow band receivers where the operational frequency is limited to a narrow range. On the other hand, filters having tunable bandwidth may be used in wideband receivers where the range of operational frequency is substantially large and covers a wider bandwidth.

FIGS. 1 and 2 show prior art tunable preselector circuits 100, 200 described in U.S. Pat. No. 5,392,011 assigned to Motorola, Inc. and which is hereby incorporated by reference. Filter 100 provides a high-side injection tunable filter while filter 200 provides a low-side injection tunable filter. These filters are typically used to provide either low-side or high-side injection protection in single band radio operation.

Dual band radio operation presents a different set of logistical problems in front end radio receiver design. Though prior art high-side or low-side filter circuits may provide a certain degree of selectivity on the opposite side, this has been insufficient to meet dual band requirements. The standard filtering solution for dual band radio designs is to use two separate filters, one providing high-side injection protection and the other providing low-side injection protection. FIG. 3 shows a block diagram of the front end portion of a typical dual band receiver circuit 300. In operation, a radio frequency (RF) signal is received at antenna 302 and switched through one of two separate paths 304, 306. Path 304 provides high-side injection protection and includes a switch 308 and a filter 310. Path 306 provides low-side injection protection and includes a switch 312 and filter 314. Amplifier 316 amplifies the filtered signal and mixer 318 mixes the amplified signal with a local oscillator frequency. Filters 310 and 314 can be implemented with circuitry such as that shown in FIGS. 1 and 2 as well as other circuits known in the art to achieve the low-side and high-side injection protection. However, it would be highly advantageous to reduce the number of paths down to a single path through the use of a single preselector. A single filter tunable capable of both high-side and low-side injection protection would further provide the benefits of reduced complexity and reduced parts count.

Accordingly, there is a need for a single filter circuit capable of providing sufficient low-side injection and high-side injection protection. Such a circuit would have applications in a variety of communication systems including receivers and transmitters.

DETAILED DESCRIPTION OF THE PREFERRED EMBODIMENT

Figure 1:
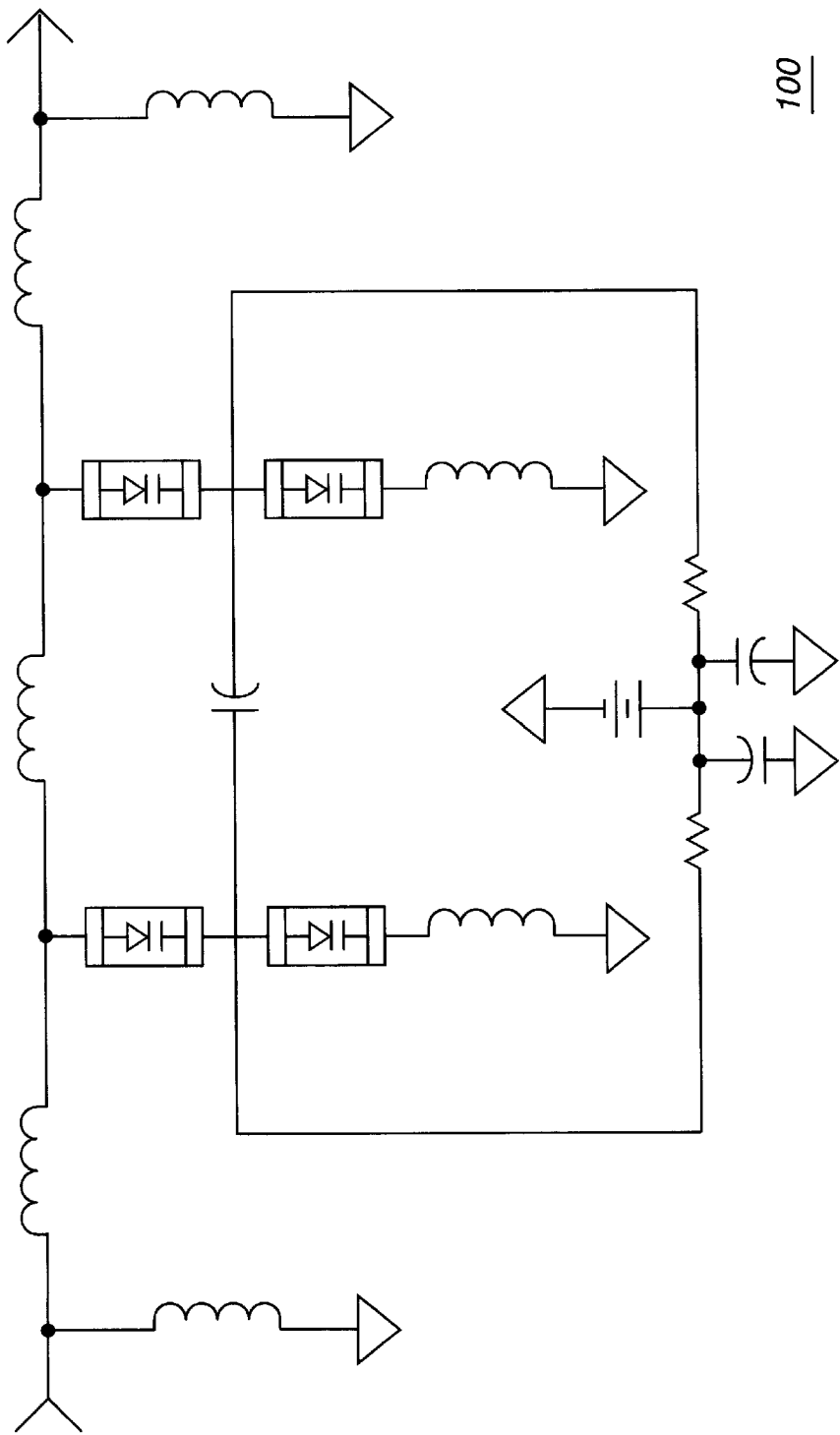
FIG. 1 is a schematic diagram of a prior art high-side injection tunable filter.
Figure 2:
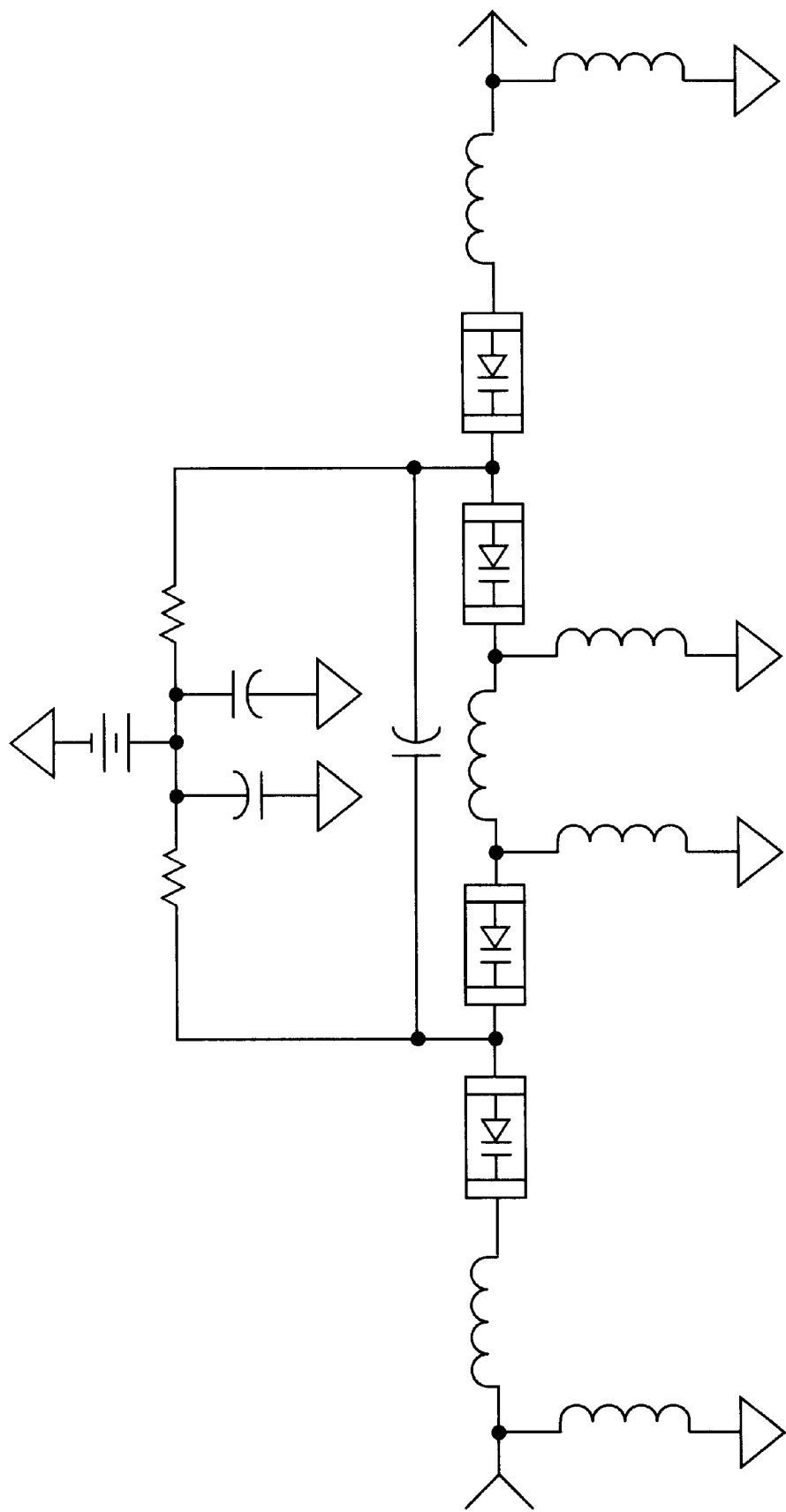
FIG. 2 is a schematic diagram of a prior art low-side injection tunable filter.
Figure 3:
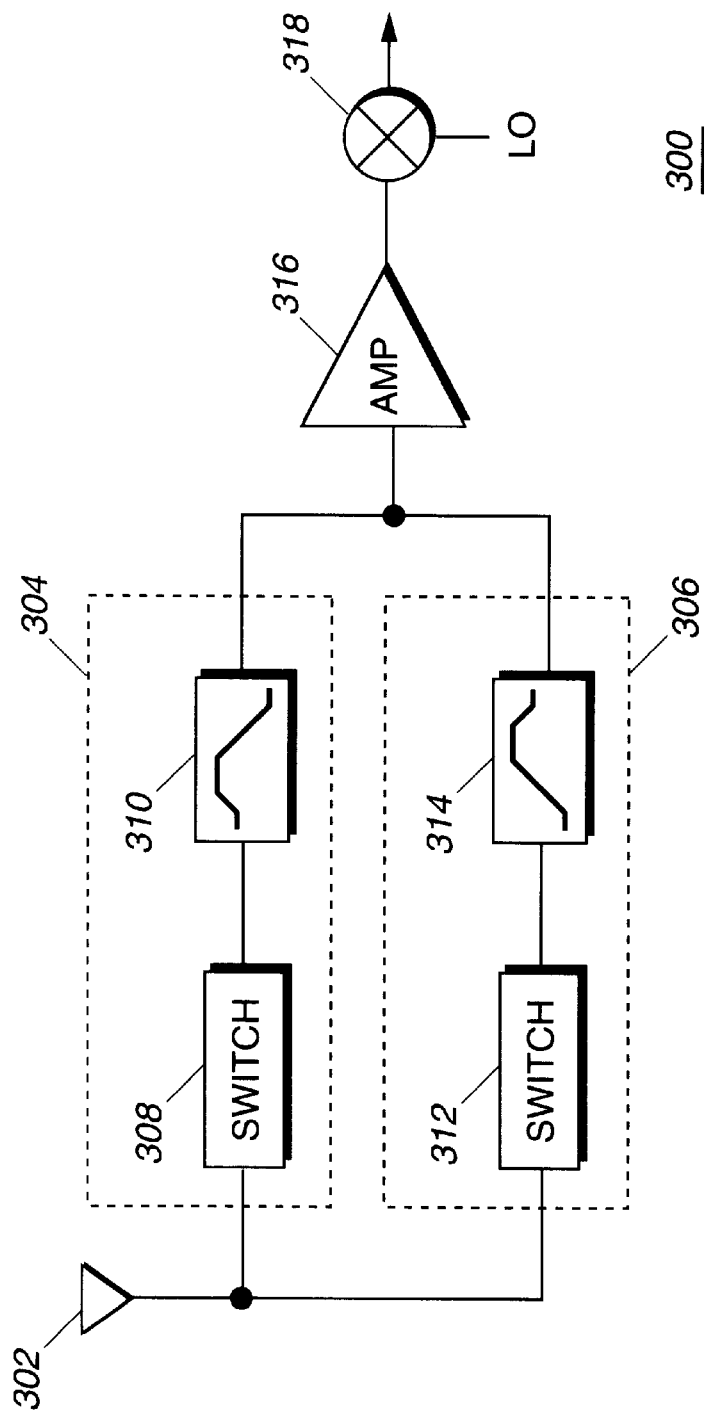
FIG. 3 is a block diagram of a prior art front-end receiver for a radio.

While the specification concludes with claims defining the features of the invention that are regarded as novel, it is believed that the invention will be better understood from a consideration of the following description in conjunction with the drawing figures, in which like reference numerals are carried forward.

The filter to be described herein is a tunable filter that provides RF selectivity to a communication device, such as a radio, and suppresses spurious response, such as image and half intermediate frequencies (IF). In accordance with the present invention this filter provides selectivity on both sides of the filter passband and can be used for both low-side and high-side injection applications. Thus, a dual band radio is now capable of operating using high-side injection at lower frequency bands as well as low-side injection at upper frequency bands while providing substantially the same amount of selectivity on both sides of the passband.

Figure 4:
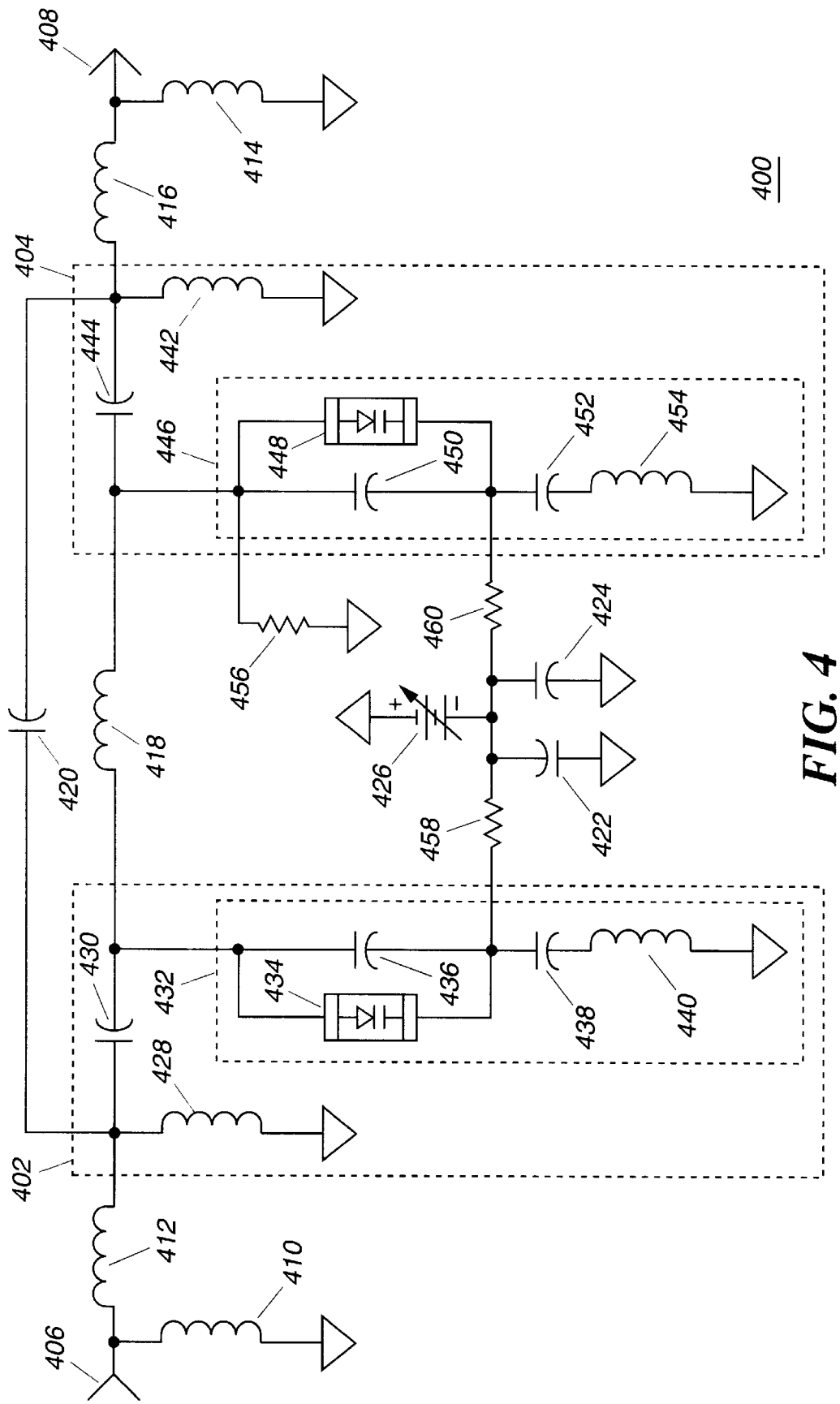
FIG. 4 is a block diagram of a tunable filter in accordance with the present invention.

Referring now to FIG. 4, there is shown a schematic diagram of a tunable filter 400 in accordance with the present invention. Filter 400 is arranged to provide front-end selectivity for a dual band receiver in which one band utilizes low-side injection while the other band utilizes high-side injection. The filter 400 comprises a two pole filter including a pair of reactively coupled first and second resonators 402 and 404. The filter 400 includes a first port 406 and a second port 408 constituting the input and output ports of the filter 400. The input port 406 is matched to some predetermined impedance, say 50 ohms, through a shunted inductor 410 and series inductor 412. Likewise the output port 408 is matched through inductors, 414, 416. The two resonators 402, 404 are reactively coupled through coupling elements, preferably by a first coupling element, inductor 418, and a second coupling element, capacitor 420. Decoupling capacitors 422, 424 provide RF filtering for the control voltage (C.V.) signal 426.

The first resonator includes an inductor 428 shunted to ground, and a capacitor 430 coupled between the shunted inductor 428 and a series resonant circuit 432. The series resonant circuit 432 includes a parallel coupled varactor 434 and capacitor 436 leading into a series capacitor 438 and shunted inductor 440. The second resonator mirrors that of the first resonator and includes inductor 442 shunted to ground, and a capacitor 444 coupled between the shunted inductor 442 and a series resonant circuit 446. The series resonant circuit 446 includes a parallel coupled varactor 448 and capacitor 450 leading into a series capacitor 452 and shunted inductor 454.

The filter 400 follows a substantially symmetrical topology in which the values of mirrored components are set at the same values. Capacitive elements 434, 436, 438 and capacitive elements 448, 450, 452 control the setting of the filter passband and the zeroes on each side of that passband. Varactors 434 and 448 are variable capacitors that provide tuning elements for shifting the entire frequency response of filter 400 up or down in frequency, and in accordance with the present invention, allow the resonators to operate as first and second tunable series resonators. Resistors 456, 458, and 460 provide bias for varactors 434 and 448. The combination of inductor 428 and capacitor 430 (LC) along with inductor 442 and capacitor 444 control the bandwidth of the filter response. In accordance with the invention, capacitors 430 and 444 play a dominant role in controlling the zeroes on both sides of the passband. Capacitors 436, 438 and 450, 452 provide fine tuning for the control voltage versus frequency operation of the filter 400. The control voltage 426 is used to simultaneously adjust the value of varactors 434 and 448. In accordance with the present invention, the use of the shunted inductor and series capacitor (LC) 428, 430, and (LC) 442, 444 mirrored onto each series resonator 432, 446 provides both high-side and low-side injection protection.

Figure 5:
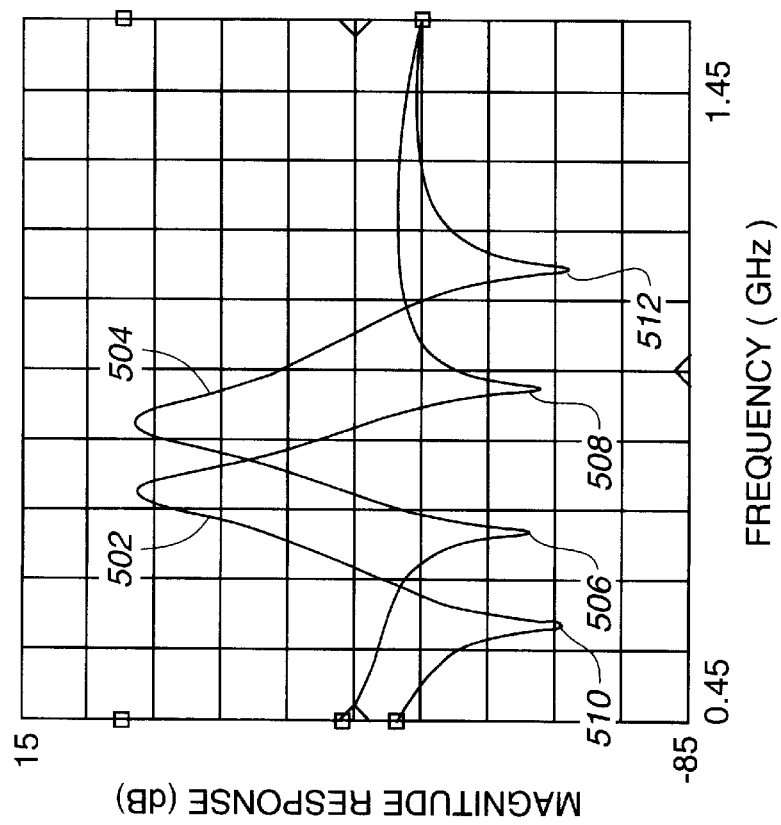
FIG. 5 is a graph depicting a simulated example of the high-side and low-side injection protection of the filter of FIG. 4 in accordance with the invention.

Referring now to FIG. 5, there is shown an example of first and second simulated filter responses 502, 504 generated with a predetermined set of component values for the topology of filter 400. The predetermined component values selected for this simulation demonstrate the tunablility of the passband frequency. In this simulation, the variable capacitors 434, 448 were altered to achieve an approximate tunable frequency range across 765–870 MHz. Curve 502 was achieved with a first tuning value for varactors 434, 448 while curve 504 was achieved with a second tuning value for varactors 434, 448. Capacitors 430 and 444 were selected to provide protection at the corresponding image frequencies 506, 508. As seen from the graph 500, high-side injection protection 508 is provided in the lower frequency band of operation 502 and low-side injection protection 506 is provided to the high band operation 504. Graph 500 further demonstrates that the filter of the present invention provides similar selectivity on both sides of the passband as seen from designators 508, 510 (curve 502) and 506, 512 (curve 504). The zeroes can be moved closer together or farther apart by changing values for capacitors 430 and 444. The topology of filter 400 provides a continuous tuning range through varactors 434, 448 and the ability to control the location of the zeroes which allows for dual injection mode operation.

Figure 6:
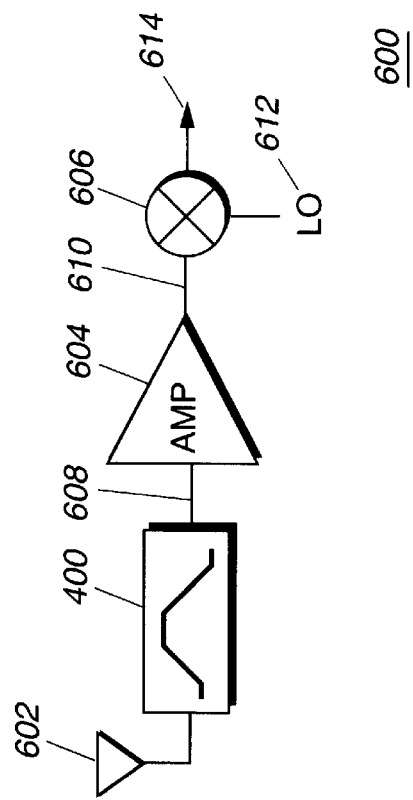
FIG. 6 is a block diagram of a receiver front end implementing the filter of FIG. 4 in accordance with the invention.

FIG. 6 shows the front end of a dual band receiver 600 implementing the filter 400 formed in accordance with the present invention. In accordance with the invention, this dual band receiver 600 processes upper band signals and lower band signals. Receiver 600 includes an antenna 602, filter 400 formed in accordance with the present invention, an amplifier 604, and a mixer 606. An RF signal, either a high band or a low band signal, is received by antenna 602 and filtered through filter 400. In accordance with the invention, filter 400 provides low-side injection protection for upper band operation as well as high-side injection protection for lower band operation. The filtered signal 608 is amplified through amplifier 604 and the amplified RF signal 610 is mixed with a local oscillator (LO) signal 612 to produce an intermediate frequency (IF signal) 614. The receiver front end 600 thus provides a single filter path capable of both low-side injection protection for high band operation and high-side injection protection for low band operation. The symmetry of filter 400 provides accurate control of desired signal rejection (i.e. the zeroes) so that a predetermined spurious frequency, such as the image frequency or half IF, substantially nulls out.

Accordingly, there has been provided a filter topology that provides for dual band operation with both high-side and low-side injection protection. Filter 400 of the present invention provides a combination of low-side and high-side frequency rejection while providing selectivity on both sides of the passband. The filter of the present invention is particularly useful as a RF preselector in a receiver to provide a continuously tunable operating band with dual injection mode operation. The filter configuration of the present invention uses fewer varactors and eliminates the need for multiple signal paths in a receiver. Bandwidth control and tunable signal rejection on both sides of the passband are advantages achieved with the filter configuration of the present invention.

Although the tunable filter of the present invention is particularly well suited for providing front-end selectivity in a receiver, it may also be advantageously utilized in a variety of transmitter filtering applications as well. The filter of the present invention provides sufficient selectivity on both sides of the passband. The use of varactors allow the zeroes to track the center frequency making the filter tunable for both high-side and low side-injection applications.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electrically tunable bandpass filter, comprising:
    a first resonator formed of a first series resonant circuit;
    a first series capacitor and shunted inductor (LC) combination coupled to the first resonator;
    a second resonator formed of a second series resonant circuit;
    a second series capacitor and shunted inductor (LC) combination coupled to the second resonator, the first LC combination and second LC combination providing a filter response having substantially symmetrical low-side injection protection and high-side injection protection;
    a first coupling element coupled between the first and second resonators; and
    a second coupling element coupled between the first and second shunted inductors.

2. The tunable bandpass filter of claim 1, wherein the first series resonant circuit includes:
    a first capacitor;
    a second capacitor coupled in series to the first capacitor; and
    a series inductor coupled between the second capacitor and ground; and
    wherein the second series resonant circuit is formed as the mirror image of the first series resonant circuit.

3. The tunable bandpass filter of claim 2, further including first and second varactors coupled to the first capacitor of each of the first and second series resonant circuits respectively, the first and second varactors for shifting the filter's entire frequency response.

4. The tunable bandpass filter of claim 1, wherein the first coupling element comprises an inductor.

5. The tunable bandpass filter of claim 1, wherein the second coupling element comprises a capacitor.

6. A dual band receiver, including:
    an antenna for receiving a radio frequency (RF) signal, the RF signal being a low-band signal or a high band signal;

a filter for filtering the RF signal into a filtered RF signal, the filter providing dual band capability through:
 a first resonator formed of a first series resonant circuit;
 a first series capacitor and shunted inductor (LC) coupled to the first resonator;
 a second resonator formed of a second series resonant circuit reactively coupled to and mirroring the first series resonant circuit;
 a second series capacitor and shunted inductor (LC) coupled to the second resonator, the first and second series capacitors for controlling zeroes on both sides of the filter passband and providing substantially symmetrical low side and high side injection protection;
an amplifier for amplifying the filtered RF signal; and
a mixer for mixing the RF signal.

7. The dual band receiver of claim 6, further including first and second varactors coupled to the first and second series resonant circuits for shifting the frequency response of the filter.

8. A preselector circuit for a receiver, comprising:
an input port for receiving a radio frequency (RF) signal, the RF signal being a low band signal or a high band signal;
first and second tunable series resonators wherein the second tunable series resonator is a mirror image of the first tunable series resonator, the first and second tunable series resonators including varactors for shifting the filter response;
a first coupling element coupled between the first and second tunable series resonators;
a first LC circuit coupled between the input port and the first tunable series resonator;
a second LC circuit coupled between the output port and the second tunable series resonator, the first and second LC circuits for controlling and providing substantially symmetrical low-side and high-side injection protection; and
a second coupling element coupled between the first and second LC circuits; and
an output port for providing a filtered RF signal.

9. The preselector of claim 8, wherein the first LC circuit comprises a series capacitor and shunted inductor and the second LC circuit is a mirror image of the first LC circuit.

10. The preselector of claim 8, wherein the first and second tunable series resonator comprises:
a parallel combination of a varactor and capacitor;
a series capacitor coupled to the parallel combination; and
a shunted inductor coupled to the series capacitor.

11. A tunable bandpass filter, comprising:
a first resonator formed of a first series resonant circuit,
a first series capacitor and shunted inductor (LC) combination coupled to the first resonator;
a second resonator formed of a second series resonant circuit;
a second series capacitor and shunted inductor (LC) combination coupled to the second resonator, the first LC combination and second LC combination providing a filter response having low-side injection protection and high-side injection protection;
a first coupling element coupled between the first and second resonators;
a second coupling element coupled between the first and second shunted inductors, and
wherein the first series resonant circuit includes:
 a first capacitor;
 a second capacitor coupled in series to the first capacitor; and
 a series inductor coupled between the second capacitor and ground; and
wherein the second series resonant circuit is formed as the mirror image of the first series resonant circuit.

12. The tunable bandpass filter of claim 11, further including first and second varactors coupled to the first capacitor of each of the first and second series resonant circuits respectively, the first and second varactors for shifting the filter's entire frequency response.

13. The tunable bandpass filter of claim 11, wherein the first coupling element comprises an inductor.

14. The tunable bandpass filter of claim 11, wherein the second coupling element comprises a capacitor.

15. A preselector circuit for a receiver, comprising:
an input port for receiving a radio frequency (RF) signal, the RF signal being a low band signal or a high band signal;
first and second tunable series resonators wherein the second tunable series resonator is a mirror image of the first tunable series resonator, each of the first and second tunable series resonators including:
 a parallel combination of a varactor and capacitor, the varactor for shifting the filter response;
 a series capacitor coupled to the parallel combination; and
 a shunted inductor coupled to the series capacitor,
a first coupling element coupled between the first and second tunable series resonators;
a first LC circuit coupled between the input port and the first tunable series resonator;
a second LC circuit coupled between the output port and the second tunable series resonator, the first and second LC circuits for controlling low-side and high-side injection protection;
a second coupling element coupled between the first and second LC circuits; and an out put port for providing a filtered RF signal.

16. The preselector of claim 14, wherein the first LC circuit a comprises a series capacitor and shunted inductor and the second first LC is a mirror image of the first LC circuit.

* * * * *